United States Patent
Niizeki et al.

(10) Patent No.: US 10,847,699 B2
(45) Date of Patent: Nov. 24, 2020

(54) OPTICAL SEMICONDUCTOR APPARATUS

(71) Applicant: NIKKISO CO., LTD., Tokyo (JP)

(72) Inventors: Shoichi Niizeki, Hakusan (JP); Hiroyasu Ichinokura, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 16/434,419

(22) Filed: Jun. 7, 2019

(65) Prior Publication Data
US 2019/0288171 A1   Sep. 19, 2019

Related U.S. Application Data

(63) Continuation of application No. PCT/JP2017/040815, filed on Nov. 13, 2017.

(30) Foreign Application Priority Data

Dec. 7, 2016   (JP) .................................. 2016-237607

(51) Int. Cl.
*H01L 33/62* (2010.01)
*H01L 23/00* (2006.01)
(Continued)

(52) U.S. Cl.
CPC .............. *H01L 33/62* (2013.01); *H01L 23/02* (2013.01); *H01L 24/29* (2013.01); *H01L 24/32* (2013.01);
(Continued)

(58) Field of Classification Search
CPC ......... H01L 33/32; H01L 33/62; H01L 33/38; H01L 33/44; H01L 2224/29083
See application file for complete search history.

(56) References Cited

U.S. PATENT DOCUMENTS

2005/0224990 A1*  10/2005  Venugopalan .......... H01L 33/32
                                                          257/778
2006/0017061 A1*   1/2006  Sakamoto ............... H01L 33/20
                                                          257/103
(Continued)

FOREIGN PATENT DOCUMENTS

EP      1 986 243 A1   10/2008
EP      3038172 A2 *    6/2016  ......... H01L 25/0753
(Continued)

OTHER PUBLICATIONS

Extended European search report issued in corresponding European application No. 17 87 8835 dated Jun. 15, 2020.
(Continued)

*Primary Examiner* — Joseph C. Nicely
(74) *Attorney, Agent, or Firm* — Muncy, Geissler, Olds & Lowe, P.C.

(57) ABSTRACT

An optical semiconductor apparatus includes: an optical semiconductor device including a translucent support substrate; a buffer layer on the support substrate, a seal ring in a frame shape provided in an outer region on the buffer layer, an active layer provided on an inner region of the buffer layer, and an electrode provided on the active layer. The optical semiconductor apparatus further including: a package substrate on which the optical semiconductor device is mounted; and a sealing part that seals a space between the seal ring and the package substrate.

6 Claims, 5 Drawing Sheets (51) Int. Cl.
   *H01L 33/38* (2010.01)
   *H01L 23/02* (2006.01)
   *H01L 33/32* (2010.01)
   *H01L 33/48* (2010.01)
   *H01L 33/54* (2010.01)

(52) U.S. Cl.
   CPC .............. *H01L 24/33* (2013.01); *H01L 33/38* (2013.01); *H01L 33/32* (2013.01); *H01L 33/486* (2013.01); *H01L 33/54* (2013.01); *H01L 2224/16225* (2013.01); *H01L 2224/29083* (2013.01); *H01L 2224/29111* (2013.01); *H01L 2224/29144* (2013.01); *H01L 2224/29166* (2013.01); *H01L 2224/29169* (2013.01); *H01L 2224/29171* (2013.01); *H01L 2224/32225* (2013.01); *H01L 2933/0016* (2013.01); *H01L 2933/0066* (2013.01)

(56) References Cited

U.S. PATENT DOCUMENTS

2012/0273814 A1* 11/2012 Pan ................. H01L 33/145
                                                                    257/88
2015/0076540 A1*  3/2015 Motojima ......... H01L 33/505
                                                                    257/98
2015/0340346 A1* 11/2015 Chu ................... H01L 25/0753
                                                                    257/89
2016/0351755 A1  12/2016 Lee et al.
2017/0062657 A1*  3/2017 Shatalov .............. F21V 5/002
2018/0069154 A1*  3/2018 Dobrinsky ............ H01L 33/44

FOREIGN PATENT DOCUMENTS

| | | | | |
|---|---|---|---|---|
| JP | H04290477 A | * | 10/1992 | |
| JP | H0730153 A | | 1/1995 | |
| JP | 2005191314 A | | 7/2005 | |
| JP | 2006128202 A | | 5/2006 | |
| JP | 2013161851 A | | 8/2013 | |
| JP | 2015056652 A | | 3/2015 | |
| JP | 2016039242 A | | 3/2016 | |
| JP | 2016127254 A | | 7/2016 | |
| JP | 2016163015 A | | 9/2016 | |
| JP | 2016195275 A | | 11/2016 | |
| WO | WO-2007029859 A1 | * | 3/2007 | ............. H01L 33/38 |
| WO | WO-2017119754 A1 | * | 7/2017 | ............. H01L 33/36 |

OTHER PUBLICATIONS

Japanese Office Action cited in counterpart application No. 2016-237607, dated Jul. 29, 2020, 6 pages with English translation.

* cited by examiner

OPTICAL SEMICONDUCTOR APPARATUS

RELATED APPLICATION

Priority is claimed to Japanese Patent Application No. 2016-237607, filed on Dec. 7, 2016, the entire content of which is incorporated herein by reference.

BACKGROUND OF THE INVENTION

1. Field of the Invention

The present invention relates to optical semiconductor apparatuses, and, more particularly, to an optical semiconductor apparatus including an optical semiconductor device.

2. Description of the Related Art

Nowadays, semiconductor light emitting devices such as light emitting diodes and laser diodes that emit blue light have been in practical use. Development of light emitting devices that output deep ultraviolet light having a shorter wavelength has also been pursued. Deep ultraviolet light has high sterilization capability. Semiconductor light emitting devices capable of outputting deep ultraviolet light have therefore attracted attention as a mercury free sterilization light source in medical and food processing fields.

A light emitting device is housed in a package to protect the device from an external environment. For example, a light emitting device is sealed by bonding a substrate on which the light emitting device is mounted and a lid body provided on the substrate. A lid body is built by setting a translucent window member in an opening of a metal frame body. A metal seal ring is provided on the outer circumference of the substrate, and the lid body is fitted between the metal frame body and the seal ring via a brazing filler metal.

An increase in the complexity of the sealing structure for protecting the device properly from an external environment leads to an increase in the number of components and the manufacturing cost. It is therefore desired to provide reliable sealing with a smaller number of components.

SUMMARY

In this background, one illustrative purpose of the present invention is to provide a technology for increasing the reliability of an optical semiconductor apparatus.

An optical semiconductor apparatus according to an embodiment of the present invention includes: an optical semiconductor device including a translucent support substrate; a buffer layer on the support substrate, a seal ring in a frame shape provided on an outer region of the buffer layer, an active layer provided on an inner region of the buffer layer, and an electrode provided on the active layer; a package substrate on which the optical semiconductor device is mounted; and a sealing part that seals a space between the seal ring and the package substrate.

According to the embodiment, the active layer provided in the inner region is sealed by the seal ring and the sealing part provided in a shape of a frame in the outer region of the optical semiconductor device. Accordingly, the active layer, which needs be protected, is sealed without using a package substrate or a lid body for sealing the active layer by encircling the entirety of the optical semiconductor device. Accordingly, the number of components required for sealing is reduced and the manufacturing cost is lowered, while at the same time maintaining the reliability of sealing.

The support substrate may be a a sapphire ($Al_2O_3$) substrate, an aluminum nitride (AlN) substrate, or an aluminum gallium nitride (AlGaN) substrate, the buffer layer may include at least one of an AlN layer and an AlGaN layer that is undoped, and the active layer may contain AlGaN.

The optical semiconductor device may further include: a first clad layer provided between the buffer layer and the active layer and on the outer region and on the inner region of the buffer layer; and a second clad layer provided between the active layer and the electrode. The seal ring may be a first electrode provided on the outer region of the first clad layer. The electrode on the active layer may be a second electrode provided on the second clad layer.

The optical semiconductor device may further include a first clad layer provided between the buffer layer and the active layer and on the inner region of the buffer layer, a second clad layer provided between the active layer and the electrode, and a first electrode provided on a first region in the inner region of the first clad layer. The active layer may be provided on a second region in the inner region of the first clad layer different from the first region, and the electrode on the active layer may be a second electrode provided on the second clad layer.

The optical semiconductor device may further include an insulating layer that covers an exposed portion of the first clad layer.

The insulating layer may further cover a side surface of the seal ring.

The first clad layer may be an n-type AlGaN layer, and the second clad layer may be a p-type AlGaN layer, and the first electrode may be an n-side electrode, and the second electrode may be a p-side electrode.

The seal ring may be a multilayer film in which titanium (Ti)/platinum (Pt)/gold (Au) or chromium (Cr)/Pt/Au are layered on the buffer layer successively.

The sealing part may contain gold-tin (AuSn).

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

The invention will now be described by reference to the preferred embodiments. This does not intend to limit the scope of the present invention, but to exemplify the invention.

A detailed description will be given of embodiments of the present invention with reference to the drawings. Same numerals are used in the description to denote same elements and duplicate descriptions are omitted as appropriate. To facilitate the understanding, the relative dimensions of the constituting elements in the drawings do not necessarily mirror the relative dimensions in the actual apparatus.

Figure 1:
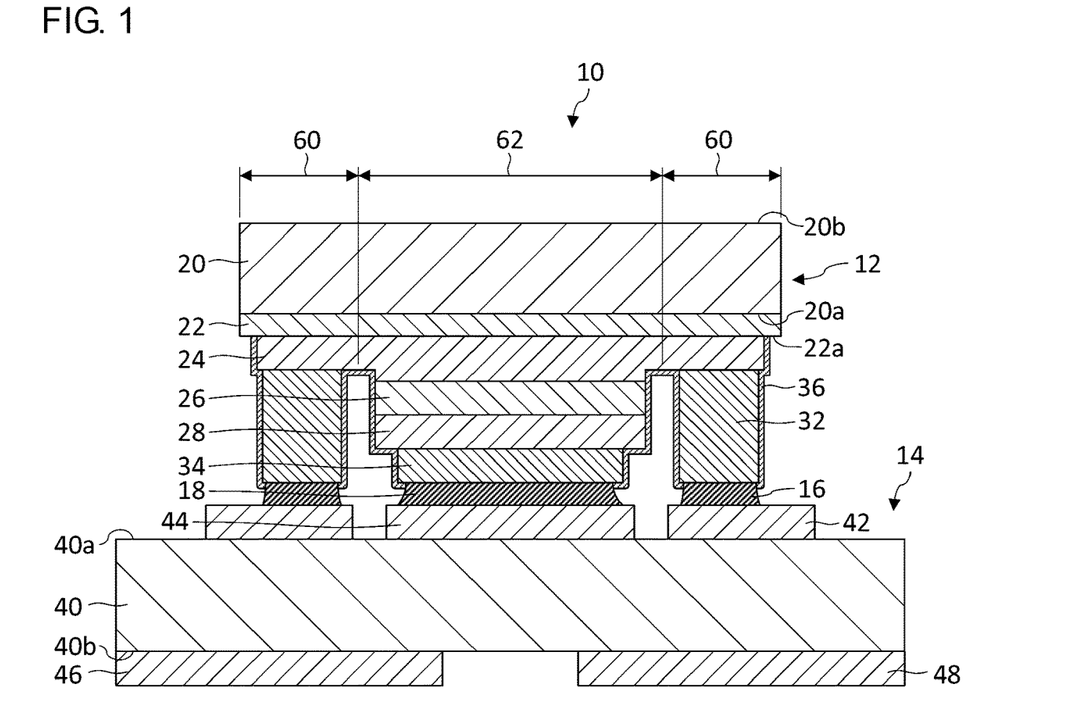
FIG. 1 is a cross-sectional view schematically showing an optical semiconductor apparatus according to an embodiment.
Figure 2:
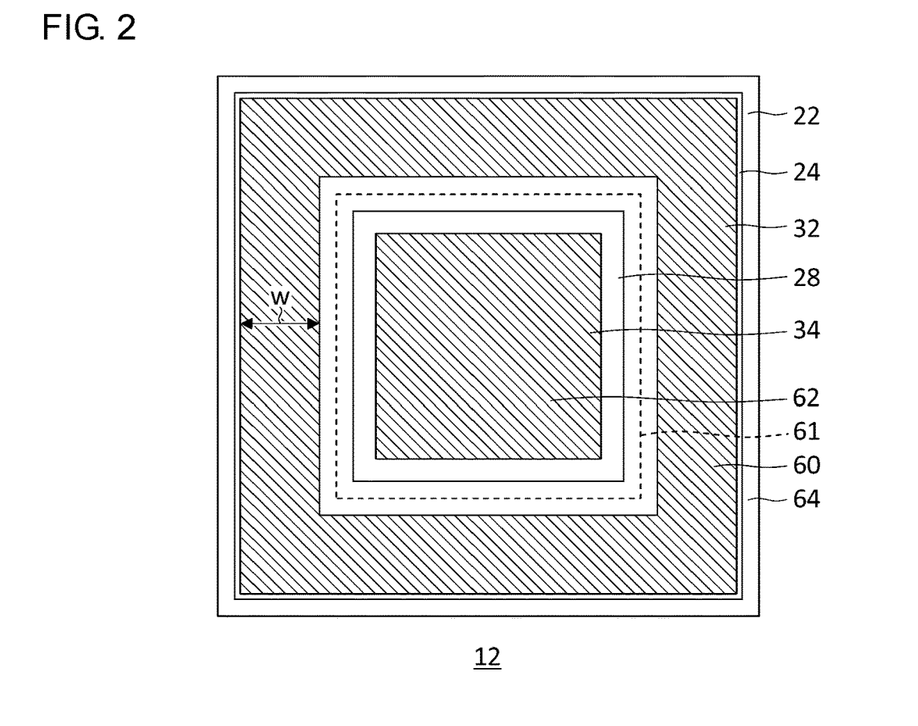
FIG. 2 is a top view schematically showing an optical semiconductor device of FIG. 1.

FIG. 1 is a cross-sectional view schematically showing an optical semiconductor apparatus 10 according to an embodiment, and FIG. 2 is a top view schematically showing an optical semiconductor device 12 of FIG. 1. The optical semiconductor apparatus 10 includes an optical semiconductor device 12, a package substrate 14, a sealing part 16, and a bonding part 18.

The optical semiconductor device 12 is a light emitting diode (LED) chip configured to emit "deep ultraviolet light" having a central wavelength λ of about 360 nm or lower. To output deep ultraviolet light having such a wavelength, the optical semiconductor device 12 is made of an aluminum gallium nitride (AlGaN) based semiconductor material having a band gap of about 3.4 eV or larger. The embodiment particularly discusses a case of emitting deep ultraviolet light having a central wavelength λ of about 240 nm-350 nm.

In this specification, the term "AlGaN-based semiconductor material" refers to a semiconductor material mainly containing aluminum nitride (AlN) and gallium nitride (GaN) and shall encompass a semiconductor material containing other materials such as indium nitride (InN). Therefore, "AlGaN-based semiconductor materials" as recited in this specification can be represented by a composition $In_{1-x-y}Al_xGa_yN$ (0≤x+y≤1, 0≤x≤1, 0≤y≤1). The AlGaN-based semiconductor material shall contain AlN, GaN, AlGaN, indium aluminum nitride (InAlN), indium gallium nitride (InGaN), or indium aluminum gallium nitride (InAlGaN).

Of "AlGaN-based semiconductor materials", those materials that do not substantially contain AlN may be distinguished by referring to them as "GaN-based semiconductor materials". "GaN-based semiconductor materials" mainly contain GaN or InGaN and encompass materials that additionally contain a slight amount of AlN. Similarly, of "AlGaN-based semiconductor materials", those materials that do not substantially contain GaN may be distinguished by referring to them as "AlN-based semiconductor materials". "AlN-based semiconductor materials" mainly contain AlN or InAlN and encompass materials that additionally contain a slight amount of GaN.

The optical semiconductor device 12 includes a support substrate 20, a buffer layer 22, a first clad layer 24, an active layer 26, a second clad layer 28, a first electrode 32, a second electrode 34, and an insulating layer 36.

The support substrate 20 is a substrate having translucency for the deep ultraviolet light emitted by the optical semiconductor device 12 and is, for example, a sapphire ($Al_2O_3$) substrate. The support substrate 20 includes a first principal surface 20a and a second principal surface 20b opposite to the first principal surface 20a. The first principal surface 20a is a principal surface that is a crystal growth surface for growing the buffer layer 22 and the layers above. The second principal surface 20b is a principal surface that is a light extraction surface for extracting the deep ultraviolet light emitted by the active layer 26 outside. In one variation, the support substrate 20 may be an aluminum nitride (AlN) substrate or an aluminum gallium nitride (AlGaN) substrate.

The buffer layer 22 is formed on the first principal surface 20a of the support substrate 20. The buffer layer 22 is a foundation layer (template layer) to form the first clad layer 24 and the layers above. For example, the buffer layer 22 is an undoped AlN layer and is, specifically, an AlN (HT-AlN; High Temperature AlN) layer gown at a high temperature. The buffer layer 22 may include an undoped AlGaN layer formed on the AlN layer. In one variation, the buffer layer 22 may be formed only by an undoped AlGaN layer when the support substrate 20 is an AlN substrate or an AlGaN substrate. In other words, the buffer layer 22 includes at least one of an undoped AlN layer and an AlGaN layer.

The first clad layer 24 is formed on the buffer layer 22. The first clad layer 24 is an AlGaN-based semiconductor material layer of the first conductivity type. For example, the first clad layer 24 is an AlGaN layer doped with silicon (Si) as an n-type impurity. The composition ratio of the first clad layer 24 is selected to transmit the deep ultraviolet light emitted by the active layer 26. For example, the first clad layer 24 is formed such that the molar fraction of AlN is 40% or higher, and, preferably, 50% or higher. The first clad layer 24 has a thickness of about 100 nm-300 nm. For example, the first clad layer 24 has a thickness of about 200 nm. The first clad layer 24 is formed slightly inward of the buffer layer 22 and is formed to avoid the outermost region 64 shown in FIG. 2. Therefore, a portion of the top surface 22a of the buffer layer 22 is exposed in the outermost region 64.

The active layer 26 is made of an AlGaN-based semiconductor material and has a double heterojunction structure by being sandwiched by the first clad layer 24 and the second clad layer 28. The active layer 26 may have a monolayer or multilayer quantum well structure. For example, the active layer 26 may be formed by stack of a barrier layer made of an AlGaN-based semiconductor material of the first conductivity type (e.g., n type) and a well layer made of an undoped AlGaN-based semiconductor material. To output deep ultraviolet light having a wavelength of 355 nm or shorter, the active layer 26 is formed to have a band gap of 3.4 eV or larger. For example, the AlN composition ratio of the active layer 26 is selected so as to output deep ultraviolet light having a wavelength of 310 nm or shorter.

The active layer 26 is formed on the first clad layer 24. The active layer 26 is not formed on the entirety of the first clad layer 24 and is formed only on an inner region 62 on the first clad layer 24. In other words, the active layer 26 is not formed in an outer region 60 outward of the inner region 62. It can therefore be said that the region in which the active layer 26 is the inner region 62, and the region in which the active layer 26 is not formed is the outer region 60.

The second clad layer 28 is formed on the active layer 26. The second clad layer 28 is an AlGaN-based semiconductor material layer of a second conductivity type different from that of the first clad layer 24. For example, the second clad layer 28 is an AlGaN layer doped with magnesium (Mg) as a p-type impurity. The second clad layer 28 has a thickness of about 300 nm-700 nm. For example, the second clad layer 28 has a thickness of about 400 nm-600 nm.

An electron block layer (not shown) may be provided between the active layer 26 and the second clad layer 28. The electron block layer is an AlGaN-based semiconductor material layer of the second conductivity type (e.g., p type). For example, the electron block layer is formed such that the molar fraction of AlN is 40% or higher, and, preferably, 50% or higher. The electron block layer may be formed such that the molar fraction of AlN is 80% or higher or may be made of an AlN-based semiconductor material that does not substantially contain GaN. The electron block layer has a thickness of about 1 nm-10 nm. For example, the electron block layer has a thickness of about 2 nm-5 nm.

The first electrode 32 is formed in the outer region 60 on the first clad layer 24. In one example, the first electrode 32 is an n-side electrode connected to the n-type first clad layer 24. The first electrode 32 is formed by a multilayer film in which titanium (Ti)/platinum (Pt)/gold (Au) or chromium (Cr)/Pt/Au are layered on the first clad layer 24 successively.

The first electrode 32 is formed in a shape of a frame that surrounds the inner region 62 in which the active layer 26 and the second clad layer 28 are formed (see FIG. 2). The first electrode 32 is a seal ring for sealing the structure provided in the inner region 62. For high sealing performance, the width w of the first electrode 32 corresponding to the difference between the outer dimension and the inner dimension is preferably 100 μm or larger, and, more preferably, 200 μm or larger.

The second electrode 34 is formed on the second clad layer 28. Therefore, the second electrode 34 is provided in the inner region 62. In one example, the second electrode 34 is a p-side electrode connected to the p-type second clad layer 28. The second electrode 34 is formed by a nickel (Ni)/gold (Au) multilayer film built on the second clad layer 28 successively.

The insulating layer 36 is a passivation layer that covers and protects the exposed portions of the first clad layer 24, the active layer 26, the second clad layer 28, the first electrode 32, and the second electrode 34. The insulating layer is made of, for example, silicon oxide ($SiO_2$), silicon nitride (SiN), or the like. The insulating layer 36 covers the side surface and top surface of the first clad layer 24 and the side surface of the first electrode 32 in the outer region 60. The insulating layer 36 covers the side surfaces of the active layer 26, the second clad layer 28, and the second electrode 34 in the inner region 62. The insulating layer 36 may cover a portion of the top surface of each of the first electrode 32 and the second electrode 34.

The package substrate 14 includes a base 40, a first upper electrode 42, a second upper electrode 44, a first lower electrode 46, and a second lower electrode 48. The base 40 is a plate-shaped member having a top surface 40a and a bottom surface 40b. The base 40 is a ceramic substrate that contains alumina ($Al_2O_3$), aluminum nitride (AlN), etc. and is, for example, a high temperature co-fired ceramic (HTCC) multilayer substrate.

The first upper electrode 42 and the second upper electrode 44 are provided on the top surface 40a of the base 40. The first upper electrode 42 is an electrode part bonded to the first electrode 32 of the optical semiconductor device 12 and has a frame shape corresponding to the first electrode 32. The second upper electrode 44 is an electrode part bonded to the second electrode 34 of the optical semiconductor device 12 and is provided inward of the first upper electrode 42 in a frame shape. The first upper electrode 42 and the second upper electrode 44 are formed by plating a base member containing tungsten (W), molybdenum (Mo), etc. with nickel (Ni), gold (Au), etc. and has, for example, a stack structure of W/Ni/Au.

The first lower electrode 46 and the second lower electrode 48 are provided on the bottom surface 40b of the base 40. The first lower electrode 46 and the second lower electrode 48 are electrodes for mounting the optical semiconductor apparatus 10 on an external substrate or the like. The first lower electrode 46 is electrically connected to the first upper electrode 42 inside the base 40. The second lower electrode 48 is electrically connected to the second upper electrode 44 inside the base 40. The first lower electrode 46 and the second lower electrode 48 will be the anode electrode or the cathode electrode of the optical semiconductor apparatus 10.

The sealing part 16 bonds the first electrode 32, i.e., the seal ring, and the package substrate 14 to seal a space therebetween. The bonding part 18 bonds the second electrode 34 and the package substrate 14. The sealing part 16 and the bonding part 18 contain gold-tin (AuSn) and is made of, for example, a gold-tin alloy containing 20-30 weight percent of tin (Sn).

FIG. 2 schematically shows the outer region 60 and the inner region 62. For ease of understanding, the insulating layer 36 is omitted in FIG. 2. The outer region 60 is a region outward of a broken line 61 in the illustration, and the inner region 62 is a region inward of the broken line 61. In this embodiment, the broken line 61 marking a boundary between the outer region 60 and the inner region 62 has a rectangular shape corresponding to the rectangular outer shape of the optical semiconductor device 12. In variations, the broken line 61 marking a boundary between the outer region 60 and the inner region 62 may be shaped in a circle, a polygonal (e.g., a triangle or a hexagon) different from a rectangle, or a loop having an irregular shape.

Figure 3:
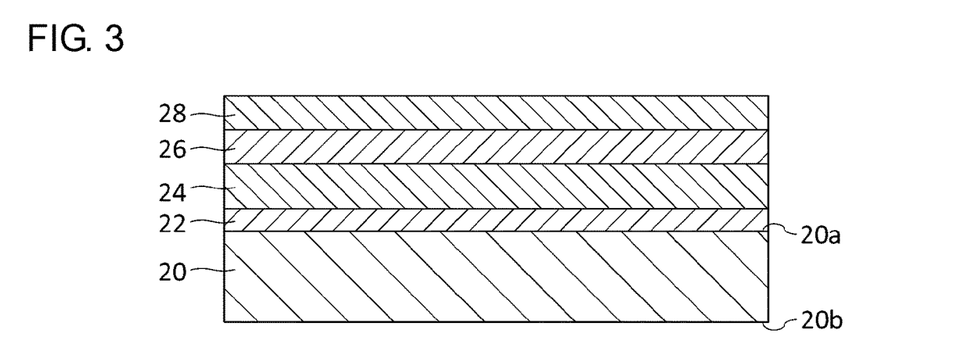
FIG. 3 is a cross-sectional view schematically showing a step of manufacturing the optical semiconductor apparatus.

A description will now be given of a method of manufacturing the optical semiconductor apparatus 10. FIGS. 3-7 are cross-sectional views schematically showing steps of manufacturing the optical semiconductor apparatus 10. First, as shown in FIG. 3, the buffer layer 22, the first clad layer 24, the active layer 26, and the second clad layer 28 are formed on the first principal surface 20a of the support substrate 20 successively. The layers formed on and above the support substrate 20 can be formed by a well-known epitaxial growth method such as the metalorganic vapor phase epitaxy (MOVPE) method and the molecular beam epitaxial (MBE) method.

Figure 4:
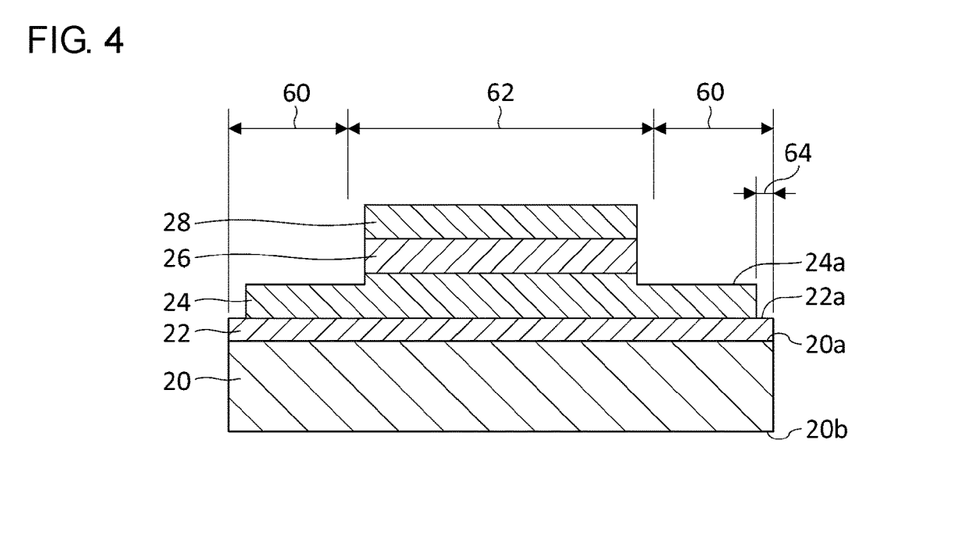
FIG. 4 is a cross-sectional view schematically showing a step of manufacturing the optical semiconductor apparatus.

Subsequently, as shown in FIG. 4, portions of the active layer 26 and the second clad layer 28 are removed in the outer region 60 so as to expose a top surface 24a of the first clad layer 24. Further, a portion of the first clad layer 24 is removed in the outermost region 64 to expose a top surface 22a of the buffer layer 22. The first clad layer 24, the active layer 26, and the second clad layer 28 may be removed by reactive ion etching or dry etching using plasma, etc.

Figure 5:
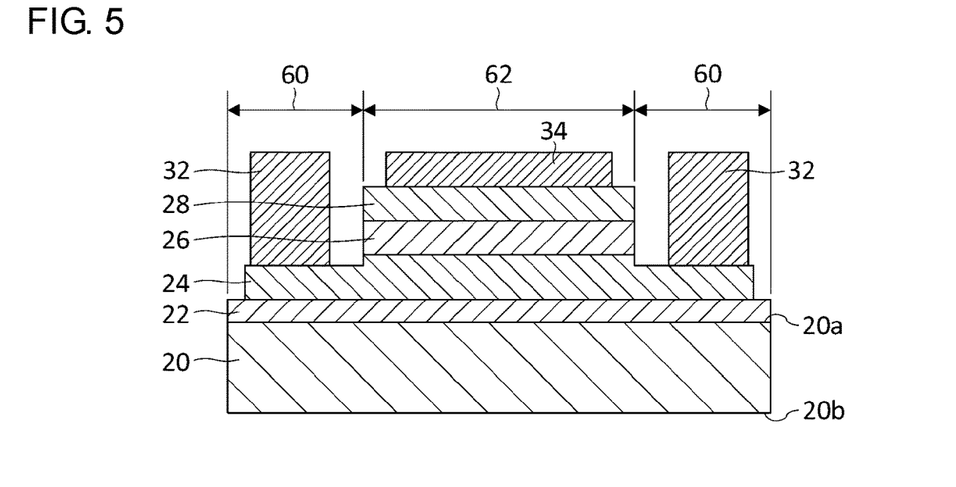
FIG. 5 is a cross-sectional view schematically showing a step of manufacturing the optical semiconductor apparatus.

Subsequently, as shown in FIG. 5, the first electrode 32 is formed on the first clad layer 24 in the outer region 60, and the second electrode 34 is formed on the second clad layer 28 in the inner region 62. For example, the first electrode 32 is formed as a multilayer film in which Ti/Pt/Au or Cr/Pt/Au are layered successively, and the second electrode 34 is formed as a multilayer film in which Ni/Au are layered successively. The first electrode 32 and the second electrode 34 may be formed by electron beam deposition, sputtering, or the like.

Figure 6:
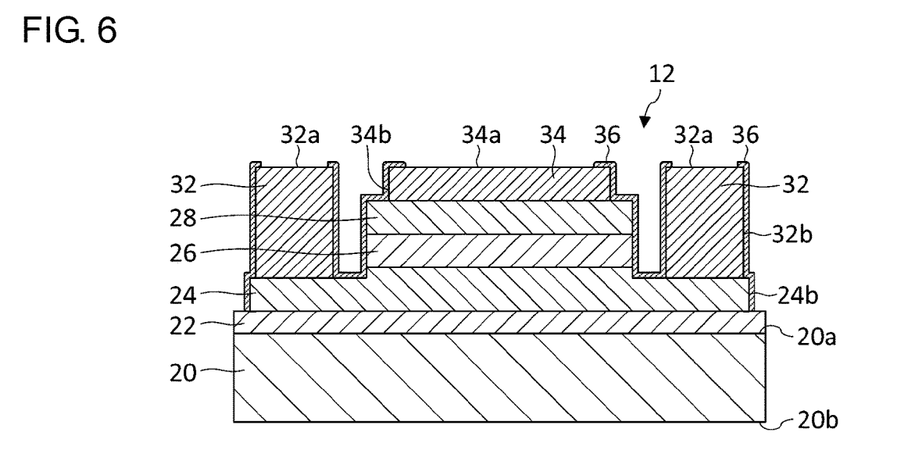
FIG. 6 is a cross-sectional view schematically showing a step of manufacturing the optical semiconductor apparatus.

Subsequently, as shown in FIG. 6, the insulating layer 36 is formed to cover the exposed portions of the first clad layer 24, the active layer 26, and the second clad layer 28. The insulating layer 36 functions as a passivation layer for covering and protecting the exposed portions of the respective layers made of an AlGaN-based semiconductor material. The insulating layer 36 is formed to cover at least a side surface 24b of the first clad layer 24 not sealed by the first electrode 32 and exposed outside. The insulating layer 36 may be formed by plasma CVD, electron beam deposition, sputtering, or the like.

As illustrated, the insulating layer 36 is formed to cover a side surface 32b of the first electrode 32 and a side surface 34b of the second electrode 34. By providing the insulating layer 36 on the side surfaces 32b, 34b of the first electrode 32 and the second electrode 34, the first electrode 32 and the second electrode 34 are suitably protected. The insulating layer 36 may be provided on a portion of top surfaces 32a, 34a of the first electrode 32 and the second electrode 34. The insulating layer 36 is provided to respectively expose at least a portion of the top surfaces 32a, 34a of the first electrode 32 and the second electrode 34 so that the first electrode 32 and the second electrode 34 can be electrically connected to the package substrate 14. This completes the optical semiconductor device 12.

Figure 7:
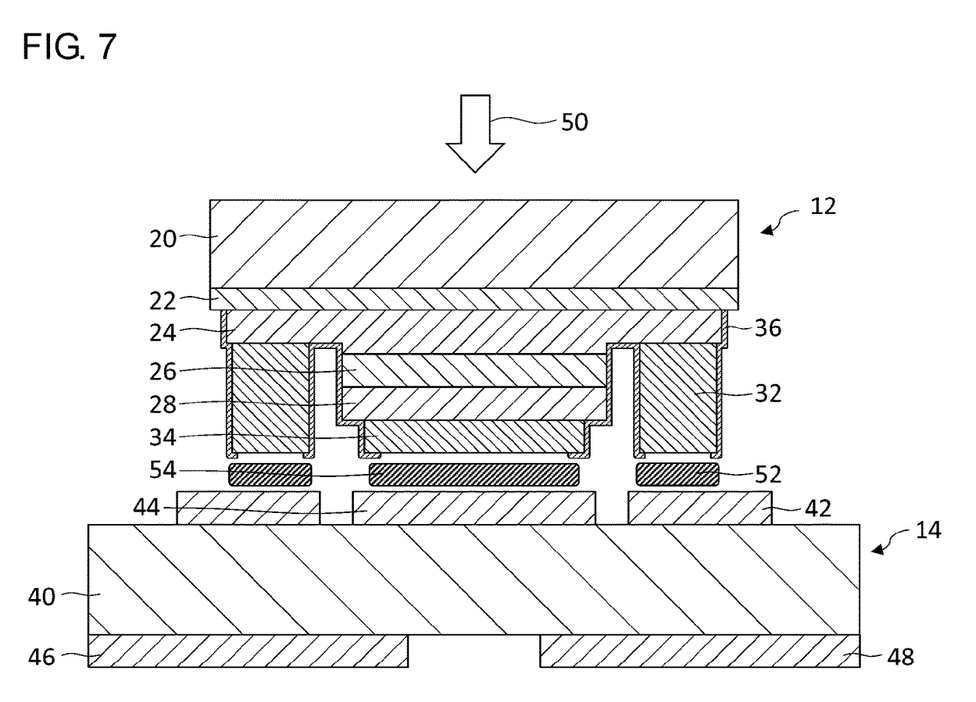
FIG. 7 is a cross-sectional view schematically showing a step of manufacturing the optical semiconductor apparatus.

Subsequently, as shown in FIG. 7, a first bonding member 52 and a second bonding member 54 are provided on the package substrate 14, and the optical semiconductor device 12 is provided on the first bonding member 52 and the second bonding member 54. The first bonding member 52 and the second bonding member 54 are preforms for bonding the optical semiconductor device 12 and the package substrate 14 and contain gold (Au) and tin (Sn). The first bonding member 52 and the second bonding member 54 have a stack structure in which Au and Sn are alternately layered. The first bonding member 52 has a shape of a frame corresponding to the first electrode 32 and the first upper electrode 42, and the second bonding member 54 has a shape of a frame corresponding to the second electrode 34 and the second upper electrode 44. Each of the first bonding member 52 and the second bonding member 54 may be temporarily fixed to the top surfaces 32a, 34a of the first electrode 32 and the second electrode 34 or temporarily fixed on the first upper electrode 42 and the second upper electrode 44. The first bonding member 52 and the second bonding member 54 may be formed by electron beam deposition or sputtering on the top surfaces 32a, 34a of the first electrode 32 and the second electrode 34 or on the first upper electrode 42 and the second upper electrode 44.

A load 50 is applied while the first bonding member 52 and the second bonding member 54 are being sandwiched between the optical semiconductor device 12 and package substrate 14. The first bonding member 52 and the second bonding member 54 are heated and melted while the load 50 is being applied. The first bonding member 52 forms AuSn eutectic bonding between the Au layer of the first electrode 32 and the Au layer of the first upper electrode 42 to form the sealing part 16. The second bonding member 54 forms AuSn eutectic bonding between the Au layer of the second electrode 34 and the Au layer of the second upper electrode 44 to form the bonding part 18. This completes the optical semiconductor apparatus 10 shown in FIG. 1.

By providing the above-described configuration, the embodiment allows the active layer 26, the second clad layer 28, and the second electrode 34 to be sealed by the first electrode 32 that define a frame surrounding the inner region 62 in which the active layer 26 is provided, the package substrate 14, and the sealing part 16. As a result, the active layer 26 is sealed without using a package substrate or a lid body for sealing the entirety of the optical semiconductor device 12, and the number of components for sealing is reduced. Furthermore, sealing of the active layer 26 is completed merely by mounting the optical semiconductor device 12 on the package substrate 14. Thus, according to the embodiment, the number of components is reduced and the manufacturing cost is reduced, while also maintaining the reliability of the optical semiconductor apparatus 10.

According to the embodiment, sealing is performed by using a gold-tin alloy having a relatively low (about 300° C.) melting temperature so that the impact of heat on the semiconductor layer during the sealing process is reduced. Further, sealing is performed by AuSn eutectic bonding instead of an adhesive member of, for example, resin, which could be deteriorated when irradiated with deep ultraviolet light. Accordingly, the reliability of sealing is improved.

Figure 8:
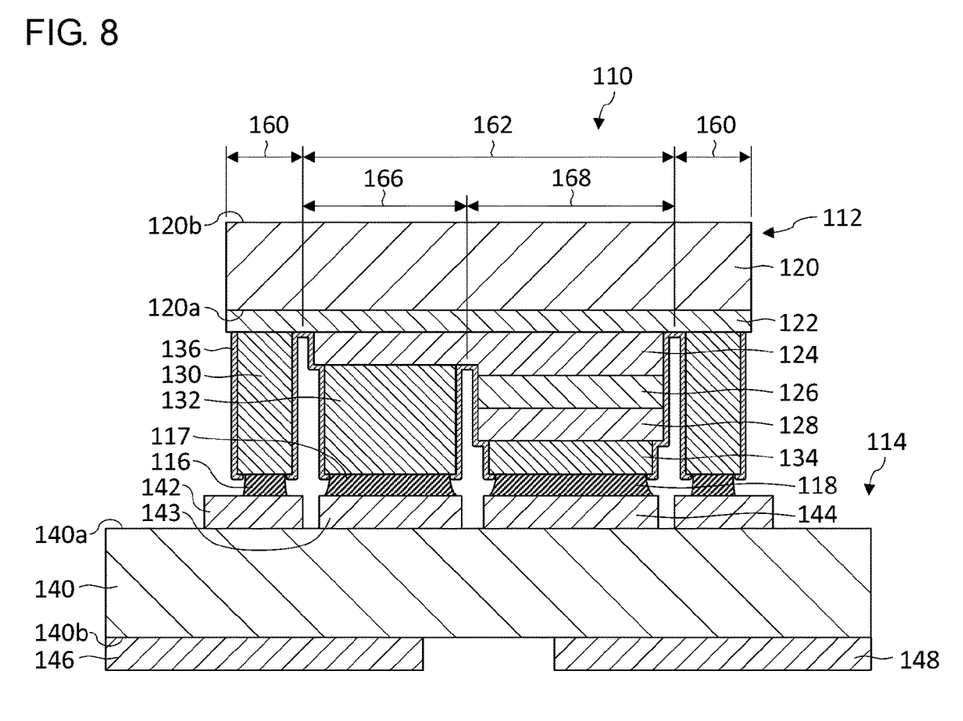
FIG. 8 is a cross-sectional view schematically showing an optical semiconductor apparatus according to a variation.
Figure 9:
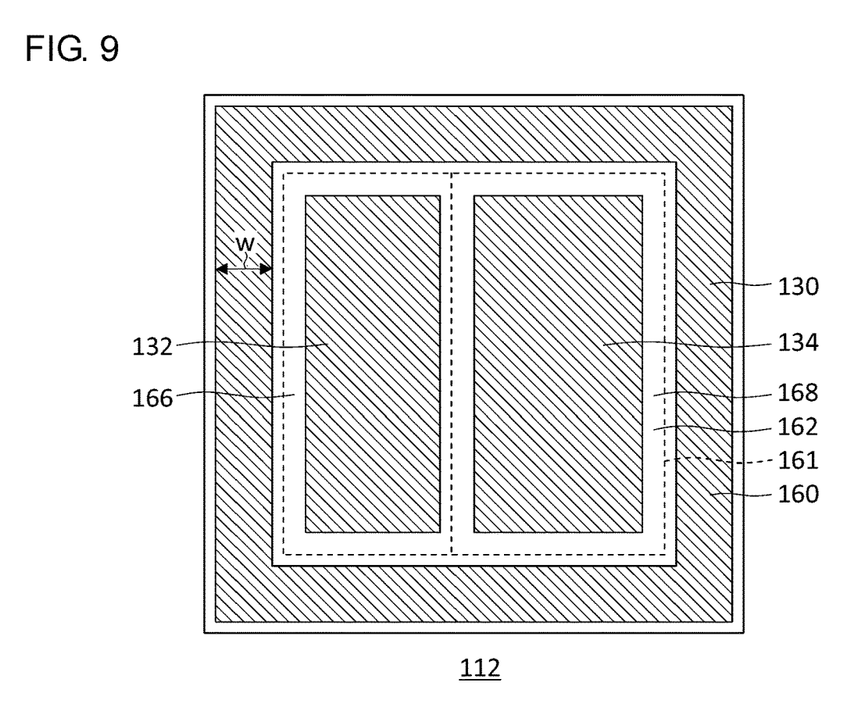
FIG. 9 is a top view schematically showing a configuration of an optical semiconductor device of FIG. 8.

FIG. 8 is a cross-sectional view schematically showing an optical semiconductor apparatus 110 according to a variation. FIG. 9 is a top view schematically showing a configuration of an optical semiconductor device 112 of FIG. 8. The variation differs from the embodiment described above in that a seal ring 130 in a frame shape is provided side from a first electrode 132 and a second electrode 134 of an optical semiconductor device 112. The following description of the variation highlights the difference from the embodiment described above.

The optical semiconductor apparatus 110 includes an optical semiconductor device 112, a package substrate 114, a sealing part 116, a first bonding part 117, and a second bonding part 118. The optical semiconductor device 112 includes a support substrate 120, a buffer layer 122, a first clad layer 124, an active layer 126, a second clad layer 128, a seal ring 130, a first electrode 132, a second electrode 134, and an insulating layer 136. The package substrate 114 includes a base 140, a sealing metal layer 142, a first upper electrode 143, a second upper electrode 144, a first lower electrode 146, and a second lower electrode 148.

The support substrate 120 includes a first principal surface 120a that is a crystal growth surface and a second principal surface 120b that is a light extraction surface. The buffer layer 122 is provided on the first principal surface 120a of the support substrate 120. The first clad layer 124 is provided on an inner region 162 of the buffer layer 122. The seal ring 130 in a frame shape is provided on an outer region 160 of the buffer layer 122. The seal ring 130 is formed by a multilayer film in which Ti/Pt/Au or Cr/Pt/Au are layered on the buffer layer 122 successively. The first electrode 132 is provided on a first region 166 of the first clad layer 124. The active layer 126 is provided on a second region 168 of the first clad layer 124 different from the first region 166. The second clad layer 128 is provided on the active layer 126. The second electrode 134 is provided on the second clad layer 128. The insulating layer 136 covers the exposed portions of the first clad layer 124, the active layer 126, and the second clad layer 128. The insulating layer 136 also covers the side surfaces of the seal ring 130, the first electrode 132, and the second electrode 134. The materials forming the optical semiconductor device 112 are the same as those of the embodiment.

The sealing metal layer 142, the first upper electrode 143, and the second upper electrode 144 are provided on the top surface 140a of the base 140. The sealing metal layer 142 is a part bonded to the seal ring 130 and has a frame shape corresponding to the seal ring 130. The first upper electrode 143 is an electrode part bonded to the first electrode 132 and is provided at a position corresponding to the first region 166. The second upper electrode 144 is an electrode part bonded to the second electrode 134 and is provided at a position corresponding to the second region 168. The sealing metal layer 142, the first upper electrode 143, and the second upper electrode 144 are formed by plating a base member containing tungsten (W), molybdenum (Mo), etc. with nickel (Ni), gold (Au), etc. and has, for example, a stack structure of W/Ni/Au. The first lower electrode 146 and the second lower electrode 148 are provided on the bottom surface 140b of the base 140. The first lower electrode 146 is electrically connected to the first upper electrode 143 inside the base 140, and the second lower electrode 148 is electrically connected to the second upper electrode 144 inside the base 140.

The sealing part 116 bonds the seal ring 130 and the sealing metal layer 142 and seals a space therebetween. The first bonding part 117 bonds the first electrode 132 and the first upper electrode 143. The second bonding part 118 bonds the second electrode 134 and the second upper electrode 144. The sealing part 116, the first bonding part 117, and the second bonding part 118 contain gold-tin. For example, the parts are made of a gold-tin alloy containing 20-30 weight % of tin (Sn).

FIG. 9 schematically shows the outer region 160 and the inner region 162. The outer region 160 is a region outward of a broken line 161 in the illustration, and the inner region 162 is a region inward of the broken line 161. The seal ring 130 in a shape of a frame is provided in the outer region 160. The inner region 162 is divided into a first region 166 and a second region 168. The first region 166 is a region where the first electrode 132 is provided, and the second region 168 is a region where the second electrode 134 is provided. In the illustrated example, each of the first region 166 and the second region 168 has a rectangular shape, but the variation is non-limiting as to the shape of the first region 166 and the second region 168. For example, the second region 168 may be provided inside the first region 166. Conversely, the first region 166 may be provided inside the second region 168.

According to this variation, the seal ring 130 provided in the outer region 160 seals the first clad layer 124, the active layer 126, the second clad layer 128, the first electrode 132, and the second electrode 134 provided in the inner region 162. As a result, sealing is completed merely by mounting the optical semiconductor device 112 on the package substrate 114. Therefore, this variation, like the embodiment and the aforementioned variation, makes it possible to reduce the manufacturing cost of the optical semiconductor apparatus 110, while also reducing the number of components necessary to seal the active layer 126 and maintaining the reliability.

Figure 10:
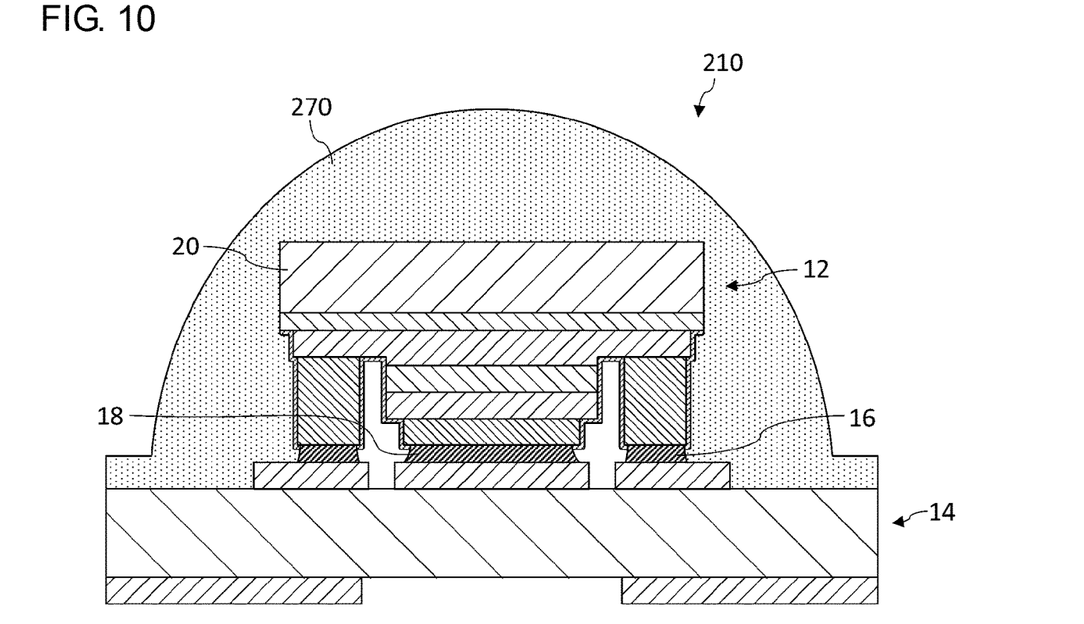
FIG. 10 is a cross-sectional view schematically showing an optical semiconductor apparatus according to another variation.

FIG. 10 is a cross-sectional view schematically showing an optical semiconductor apparatus 210 according to another variation. The optical semiconductor apparatus 210 includes the optical semiconductor device 12, the package substrate 14, the sealing part 16, the bonding part 18, and a resin protective layer 270. This variation differs from the embodiment described above in that the resin protective layer 270 is provided around the optical semiconductor device 12. The following description of the variation highlights the difference from the embodiment described above.

The resin protective layer 270 covers the exposed portion of the optical semiconductor device 12 mounted on the package substrate 14 to protect the optical semiconductor device 12. The resin protective layer 270 is made of a resin material having translucency. It is also preferred that the resin protective layer 270 be made of a material having a refractive index lower than that of the support substrate 20 that is the light extraction surface. For example, fluororesin, silicone resin, epoxy resin, or the like may be used in the resin protective layer 270. The resin protective layer 270 may function as a lens by being configured to have a dome shape as illustrated.

According to this variation, the optical semiconductor device 12 is physically protected by providing the resin protective layer 270. The active layer 26 of the optical semiconductor device 12 is sealed by the seal ring. It is therefore not necessary for the resin protective layer 270 to have a high sealing performance. For example, a resin material that could be deteriorated by the deep ultraviolet light emitted by the optical semiconductor device 12 may be used. In other words, it is not necessary to select a resin material of the resin protective layer 270 having a high durability against light and a high sealing performance, and a relatively inexpensive resin material can be used. Thus, according to this variation, the manufacturing cost is prevented from increasing significantly even when the resin protective layer 270 is provided.

Figure 11:
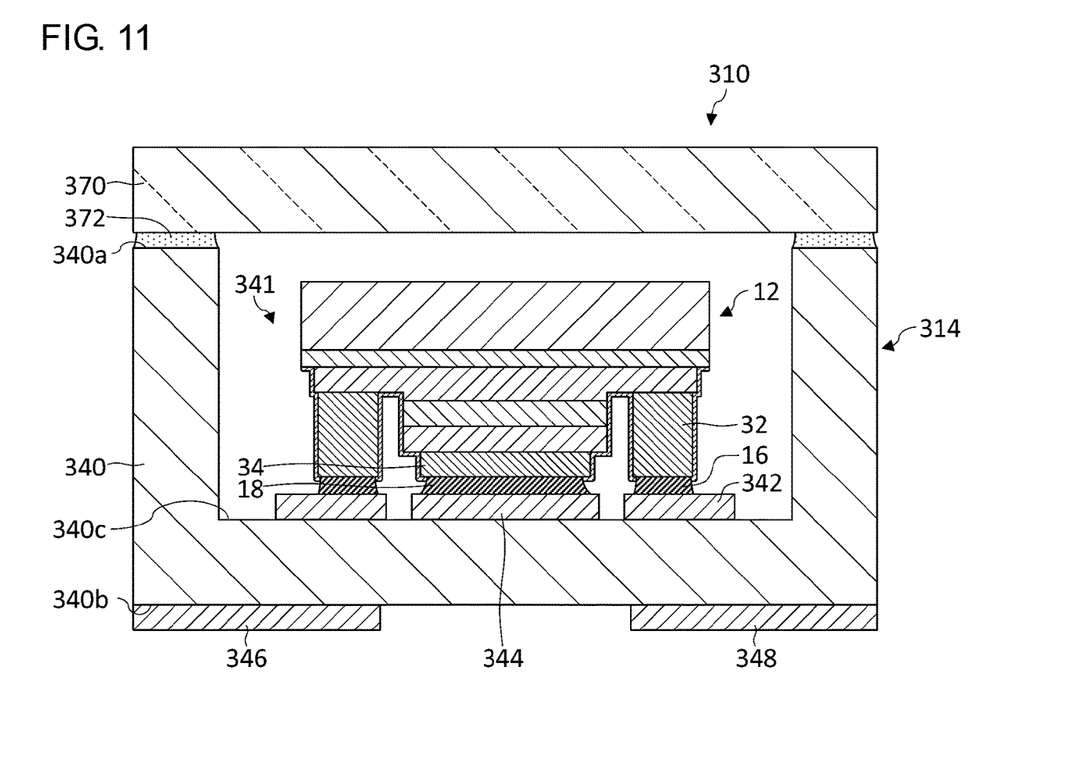
FIG. 11 is a cross-sectional view schematically showing an optical semiconductor apparatus according to further another variation.

FIG. 11 is a cross-sectional view schematically showing an optical semiconductor apparatus 310 according to further another variation. The optical semiconductor apparatus 310 includes the optical semiconductor device 12, a package substrate 314, the sealing part 16, the bonding part 18, a lid body 370, and an adhesive layer 372. This variation differs from the embodiment described above in that the optical semiconductor device 12 is housed inside a package base 340 having a recess 341, and a lid body 370 is provided to cover a space over the recess 341. The following description of the variation highlights the difference from the embodiment described above.

The package substrate 314 includes a package base 340, a first upper electrode 342, a second upper electrode 344, a first lower electrode 346, and a second lower electrode 348. The package base 340 is provided with a recess 341 that opens on a top surface 340a and is shaped such that the circumference of the recess 341 is bounded in a frame shape. The first upper electrode 342 and the second upper electrode 344 are provided on a bottom surface 340c of the recess 341. The first upper electrode 342 is bonded to the first electrode 32 by the sealing part 16, and the second upper electrode 344 is bonded to the second electrode 34 by the bonding part 18. The first lower electrode 346 and the second lower electrode 348 are provided on a bottom surface 340b of the package base 340. The lid body 370 is mounted on the top surface 340a of the package base 340 via the adhesive layer 372.

The lid body 370 is a plate-shaped window member that transmits the deep ultraviolet light emitted by the optical semiconductor device 12 and is made of quartz ($SiO_2$), sapphire ($Al_2O_3$), or the like. The lid body 370 is mounted on the top surface 340a of the package base 340 by the adhesive layer 372. The adhesive layer 372 adhesively bonds the package base 340 and the lid body 370. The variation is non-limiting as to the material of the adhesive layer 372. For example, epoxy resin, acrylic resin, silicone resin, urethane resin, polyimide resin, polyamide resin, polyester resin, melamine resin, phenol resin, fluororesin, etc. may be used.

According to this variation, the optical semiconductor device 12 is physically protected by housing the optical semiconductor device 12 in the recess 341 of the package base 340 and covering the assembly by the lid body 370. The active layer 26 of the optical semiconductor device 12 is sealed by the seal ring. It is therefore not necessary for the adhesive layer 372 to have a high sealing performance. For example, a resin material that could be deteriorated by the deep ultraviolet light emitted by the optical semiconductor device 12 may be used. In other words, it is not necessary to select a material of the adhesive layer 372 having a high durability against light and a high sealing performance, and a relatively inexpensive resin material can be used. Thus, according to this variation, the manufacturing cost is prevented from increasing significantly even when the package base 340 and the lid body 370 are provided.

Described above is an explanation based on an exemplary embodiment. The embodiment is intended to be illustrative only and it will be understood by those skilled in the art that various design changes are possible and various modifications are possible and that such modifications are also within the scope of the present invention.

The embodiment and the variations described above have shown the optical semiconductor apparatus provided with a light emitting device. In a further variation, the sealing structure described above may be used to seal a light receiving device. For example, the structure described above may be used to seal a light receiving device for receiving deep ultraviolet light.

The embodiment and the variations described above have shown the case in which the first clad layer 24 is made of an n-type semiconductor material, and the second clad layer 28 is made of a p-type semiconductor material. In a further variation, the conductivity type may be reversed. The first clad layer 24 may be a p type, and the second clad layer 28 may be an n type.

The embodiment and the variation described above have shown the case of using a high temperature co-fired ceramic (HTCC) multilayer substrate as a material of the substrate. In a further variation, the ceramic material used may be a low temperature co-fired ceramic (LTCC) multilayer substrate containing silica ($SiO_2$), calcium oxide (CaO), boron oxide ($B_2O_3$), etc. In this case, the electrode or the sealing metal layer may be formed on the substrate by using a metal material having a relatively low melting point such as copper (Cu) and silver (Ag) in place of a high melting point material such as tungsten and molybdenum and forming a multilayer film of Ni/Au on the base member.

What is claimed is:

1. An optical semiconductor apparatus comprising:
    an optical semiconductor device including:
        a translucent support substrate;
        a buffer layer on the support substrate;
        a seal ring that is a metal layer in a frame shape provided on an outer region of the buffer layer,
        a first clad layer provided on an inner region of the buffer layer;
        a first electrode provided on a first region in the inner region of the first clad layer;
        an active layer provided on a second region different from the first region in the inner region of the first clad layer;
        a second clad layer provided on the active layer; and
        a second electrode provided on the second clad layer;
    a package substrate on which the optical semiconductor device is mounted; and
    a sealing part that seals a space between the seal ring and the package substrate.

2. The optical semiconductor apparatus according to claim 1, wherein
    the support substrate is a sapphire ($Al_2O_3$) substrate, an aluminum nitride (AlN) substrate, or an aluminum gallium nitride (AlGaN) substrate,
    the buffer layer includes at least one of an AlN layer and an AlGaN layer that is undoped, and
    the active layer contains AlGaN.

3. The optical semiconductor apparatus according to claim 1, wherein
    the optical semiconductor device further includes an insulating layer that covers an exposed portion of the first clad layer, a side surface of each of the first electrode, the second electrode, and the seal ring, and a portion of a top surface of each of the first electrode, the second electrode, and the seal ring that faces the package substrate.

4. The optical semiconductor apparatus according to claim 1, wherein
    the first clad layer is an n-type AlGaN layer, and the second clad layer is a p-type AlGaN layer, and
    the first electrode is an n-side electrode, and the second electrode is a p-side electrode.

5. The optical semiconductor apparatus according to claim 1, wherein
    the seal ring is a multilayer film in which titanium (Ti)/platinum (Pt)/gold (Au) or chromium (Cr)/Pt/Au are layered on the buffer layer successively.

6. The optical semiconductor apparatus according to claim 1, wherein
    the sealing part contains gold-tin (AuSn).

* * * * *